(12) United States Patent
Park

(10) Patent No.: US 9,685,240 B1
(45) Date of Patent: Jun. 20, 2017

(54) MEMORY DEVICE TO ALLEVIATE THE EFFECTS OF ROW HAMMER CONDITION AND MEMORY SYSTEM INCLUDING THE SAME

(71) Applicant: SK hynix Inc., Icheon-si, Gyeonggi-do (KR)

(72) Inventor: Min Su Park, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/204,010

(22) Filed: Jul. 7, 2016

(30) Foreign Application Priority Data

Mar. 17, 2016 (KR) .................. 10-2016-0032320

(51) Int. Cl.
G11C 29/00 (2006.01)
G11C 11/406 (2006.01)
G11C 11/4096 (2006.01)
G11C 11/408 (2006.01)
G11C 7/24 (2006.01)

(52) U.S. Cl.
CPC ............... *G11C 29/00* (2013.01); *G11C 7/24* (2013.01); *G11C 11/4085* (2013.01); *G11C 11/4096* (2013.01); *G11C 11/40615* (2013.01); *G11C 29/808* (2013.01); *G11C 11/408* (2013.01)

(58) Field of Classification Search
CPC ..... G11C 7/24; G11C 29/808; G11C 11/4085; G11C 11/40615; G11C 11/4096; G11C 11/408
See application file for complete search history.

(56) References Cited

U.S. PATENT DOCUMENTS

| | | | |
|---|---|---|---|
| 2001/0009521 A1* | 7/2001 | Hidaka | G11C 29/808 365/200 |
| 2014/0085995 A1* | 3/2014 | Greenfield | G11C 7/24 365/201 |
| 2014/0177370 A1 | 6/2014 | Halbert et al. | |
| 2015/0170733 A1 | 6/2015 | Lee et al. | |
| 2015/0262652 A1* | 9/2015 | Igarashi | G11C 11/408 711/106 |
| 2016/0202926 A1* | 7/2016 | Benedict | G11C 11/408 711/106 |

FOREIGN PATENT DOCUMENTS

| KR | 100961206 B1 | 5/2010 |
|---|---|---|
| KR | 101003493 B1 | 12/2010 |

* cited by examiner

*Primary Examiner* — Harry W Byrne
*Assistant Examiner* — Ajay Ojha
(74) *Attorney, Agent, or Firm* — William Park & Associates Ltd.

(57) ABSTRACT

There may be provided a memory or memory system. A memory may include an active cell array comprising a plurality of unit cells coupled to a word line and configured to store an active count of the word line. The memory may include a read control circuit configured to read the active count of the word line from the active cell array. The memory may be configured to refresh an adjacent word line of the corresponding word line based on the active count of the word line.

18 Claims, 10 Drawing Sheets

MEMORY DEVICE TO ALLEVIATE THE EFFECTS OF ROW HAMMER CONDITION AND MEMORY SYSTEM INCLUDING THE SAME

CROSS-REFERENCES TO RELATED APPLICATION

The present application claims priority under 35 U.S.C. §119(a) to Korean application number 10-2016-0032320, filed on Mar. 17, 2016, in the Korean Intellectual Property Office, which is incorporated herein by reference in its entirety.

BACKGROUND

1. Technical Field

Various embodiments may generally relate to a memory and a system including the same and method of operating the same, and more particularly, to a technology related to refresh.

2. Related Art

With an increase in integration density of a memory, the distance between word lines included in a memory has been reduced. The reduction in distances between word lines has in return increased a coupling effect between adjacent word lines.

Whenever data is inputted to or outputted from a memory cell, a word line toggles between an active state and an inactive state. With the increase of the coupling effect between adjacent word lines, data of a memory cell coupled to a word line adjacent to a frequently enabled word line may be damaged.

Such a phenomenon is referred to as word line disturbance. Due to the word line disturbance, data of a memory cell may be damaged before the memory cell is refreshed.

SUMMARY

In an embodiment of the present disclosure, a memory may be provided. The memory may include an active cell array including a plurality of unit cells coupled to a word line and configured to store an active count of the word line. The memory may include a read control circuit configured to read data stored in the active cell array based on a strobe signal. The memory may include a write control circuit configured to store write data in the active cell array based on a write enable signal. The memory may include an active control circuit configured to generate the strobe signal and the write enable signal, and activate a row hammer flag signal for refreshing an adjacent word line of the corresponding word line based on output data of the read control circuit.

In an embodiment of the present disclosure, a memory system may be provided. The memory system may include a cell array configured to perform any one of read, write and refresh operations for data, when a word line is enabled. The memory system may include an active cell array including a plurality of unit cells coupled to the word line and configured to store an active count of the word line. The memory system may include a refresh control circuit configured to control the read or write operation of the active cell array, and activate a row hammer flag signal for refreshing an adjacent word line of the corresponding word line based on the active count of the word line.

In an embodiment of the present disclosure, a memory may be provided. The memory may include an active cell array comprising a plurality of unit cells coupled to a word line and configured to store an active count of the word line. The memory may include a read control circuit configured to read the active count of the word line from the active cell array. The memory may be configured to refresh an adjacent word line of the corresponding word line based on the active count of the word line.

In an embodiment of the present disclosure, a memory comprising: an active cell array comprising a plurality of unit cells coupled to a word line and configured to store an active count of the word line; and a read control circuit configured to read the active count of the word line from the active cell array, wherein the memory is configured to refresh an adjacent word line of the corresponding word line based on the active count of the word line.

Wherein the memory is configured to refresh the adjacent word line of the corresponding word line when the active count of the word line corresponds to a preset value.

A write control circuit configured to store write data in the active cell array based on a write enable signal; an active control circuit configured to generate a strobe signal and the write enable signal, and activate a row hammer flag signal for refreshing the adjacent word line of the corresponding word line based on output data of the read control circuit, wherein the read control circuit is configured to read data stored in the active cell array based on the strobe signal.

Wherein the active control circuit controls the strobe signal and the write enable signal based on a row active signal.

Wherein the active control circuit comprises: a row hammer control circuit configured to delay a row active signal, and generate the strobe signal, the write enable signal and a column enable signal; and a counting control circuit configured to count the data applied from the read control circuit and output the write data and the row hammer flag signal.

Wherein the row hammer control circuit comprises: a pulse generator configured to generate a pulse signal based on the row active signal; and a delay circuit configured to generate the column active signal by delaying an output of the pulse generator.

In an embodiment of the present disclosure, a method of operating a memory including a plurality of unit cells may be provided. The method may include storing an active count of a word line of an active cell array within the active cell array, the active cell array comprising the plurality of unit cells coupled to the word line. The method may include reading the active count of the word line from the active cell array with a read control circuit. The method may include refreshing an adjacent word line of the corresponding word line based on the active count of the word line.

DETAILED DESCRIPTION

Hereinafter, a memory and a system including the same according to the present disclosure will be described below with reference to the accompanying drawings through examples of embodiments.

Various embodiments may be directed to a memory capable of determining whether a specific word line was activated a preset number of times or more and refreshing an adjacent word line of the corresponding word line, and a system including the memory.

Figure 1:
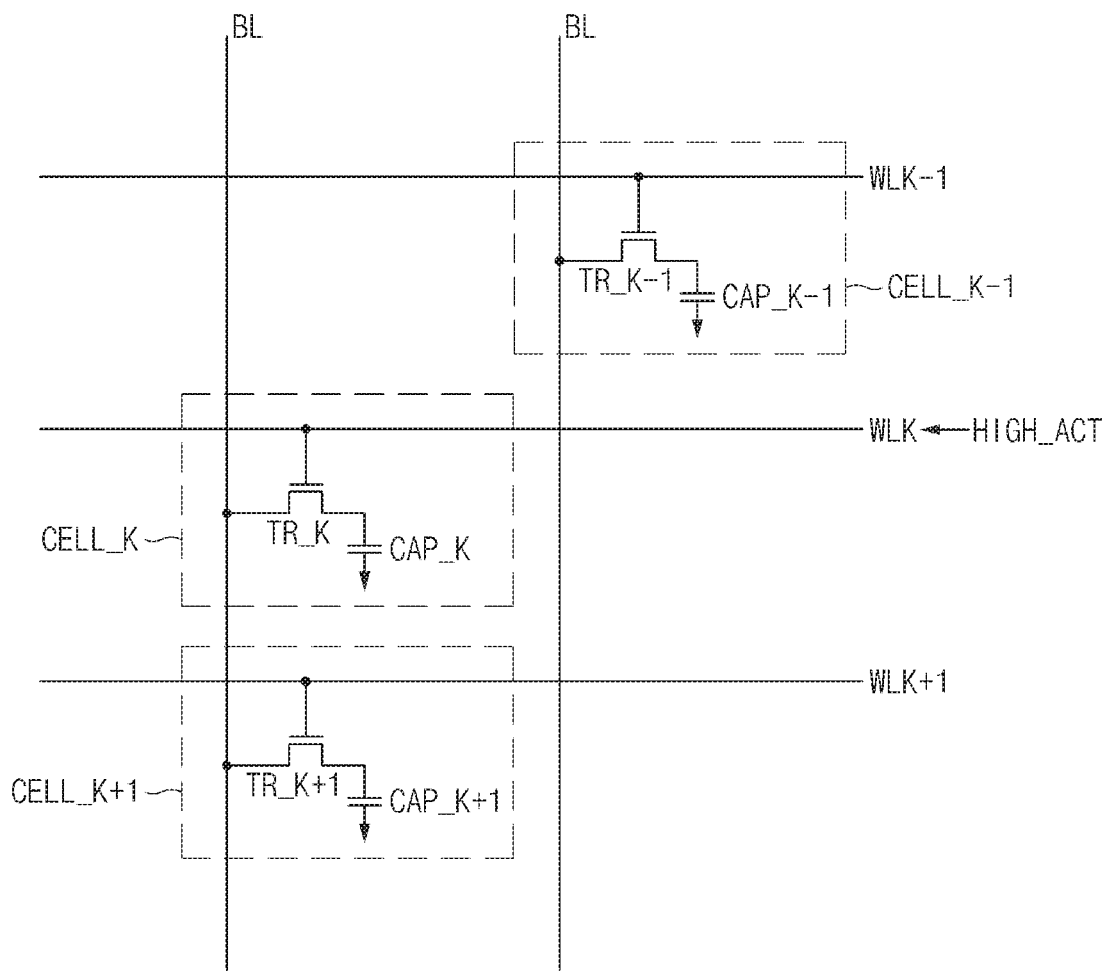
FIG. 1 is a diagram for describing word line disturbance, illustrating a representation of an example of a part of a cell array included in a memory.

FIG. 1 is a diagram for describing word line disturbance, illustrating a representation of an example of a part of a cell array included in a memory.

Referring to FIG. 1, 'WLK' represents a word line of which the active count is high, and 'WLK−1' and 'WLK+1' represent word lines adjacent to the word line WLK, that is, the word line of which the active count is high. 'CELL_K' represents a memory cell coupled to the word line WLK, 'CELL_K−1' represents a memory cell coupled to the word line WLK−1, and 'CELL_K+1' represents a memory cell coupled to the word line WLK+1. The memory cells may include cell transistors TR_K, TR_K−1 and TR_K+1 and cell capacitors CAP_K, CAP_K−1 and CAP_K+1, respectively.

Referring to FIG. 1, when the word line WLK is activated or deactivated, a coupling effect may occur between the word line WLK and the word lines WLK−1 and WLK+1, thereby affecting the amounts of charge stored in the cell capacitors CELL_K−1 and CELL_K+1 while raising or lowering the voltages of the word lines WLK−1 and WLK+1.

Thus, when the word line WLK toggles between an active state and an inactive state because the word line WLK is frequently activated, the amounts of charge stored in the cell capacitors CAP_K−1 and CAP_K+1 included in the memory cells CELL_K−1 and CELL_K+1 may be changed, and data of the memory cells may be deteriorated.

Furthermore, electromagnetic waves generated while the word line toggles between an active state and an inactive state may introduce electrons into the cell capacitors of the memory cells coupled to the adjacent word lines or leak electrons from the cell capacitors, thereby damaging the data.

When a specific word line WLK is repetitively activated a predetermined number of times or more, data of memory cells coupled to the adjacent word lines WLK+1 and WLK−1 may be deteriorated. Such a phenomenon may be referred to as row hammering. In order to suppress the row hammering, an active operation may be performed on the word lines WLK+1 and WLK−1 adjacent to the word line WLK which is frequently activated.

As an active operation is performed on the adjacent word lines WLK+1 and WLK−1, the data of the memory cells coupled to the adjacent word lines WLK+1 and WLK−1 may be rewritten, which makes it possible to prevent the damage of the data.

In general, a semiconductor device such as DRAM may include a large number of memory cells, and each of the memory cells may include a transistor serving as a switch and a capacitor for storing data. However, since a leakage current occurs due to a structural characteristic of the memory cell such as a PN junction of the transistor, the initial data stored in the capacitor may be lost. Thus, the semiconductor device requires a refresh operation of recharging the memory cell before the data are lost.

A normal refresh operation may include an auto refresh operation and a self refresh operation. The auto refresh operation refers to a mode in which a semiconductor device performs a refresh operation according to a refresh command applied from outside, and the self refresh operation refers to a mode in which a semiconductor device performs a refresh operation while sequentially changing an internal address according to a refresh command applied from outside.

In addition to the normal refresh operation, an additional refresh operation is performed on a row which is highly likely to lose data due to row hammering. The row hammering refers to a phenomenon in which data of memory cells coupled to a corresponding row or adjacent rows are lost due to a high active count.

Thus, a memory according to an embodiment may determine whether a target word line was activated a specific number of times or more, and refresh the target word line and adjacent word lines before the target word line is activated the specific number of times or more, thereby reducing the occurrence of defects by the row hammering.

Figure 2:
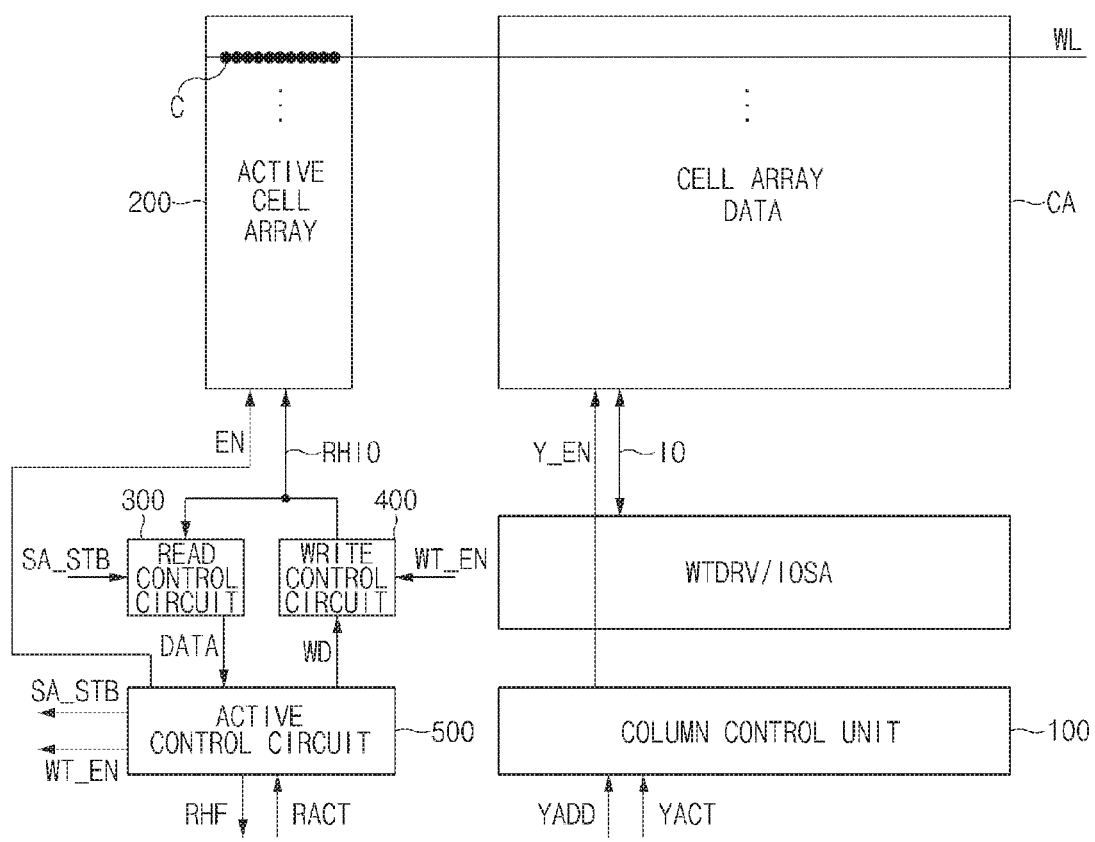
FIG. 2 is a configuration diagram illustrating a representation of an example of a memory according to an embodiment.

FIG. 2 is a configuration diagram illustrating a representation of an example of a memory according to an embodiment.

The memory according to an embodiment may include a cell array CA, a write driving circuit WTDRV, a sense amplifier IOSA, a column control circuit 100, an active cell array 200, a read control circuit 300, a write control circuit 400 and an active control circuit 500. The read control circuit 300, the write control circuit 400 and the active control circuit 500 may be collectively referred to as "refresh control circuit".

In the cell array CA, when a word line WL is activated, one or more memory cells may be activated to perform a data read or write operation. The write driving circuit WTDRV may drive input data during a write operation, and write the driven data to the cell array CA through an input/output line IO. The sense amplifier IOSA may sense and amplify read data applied from the cell array CA through the input/output line IO.

The column control circuit 100 may control a column enable signal Y_EN in response to a column active signal YACT and a column address YADD. The column enable signal Y_EN may be used to select a column line of the cell array CA.

The active cell array 200 may separately store the counts at which the respective word lines WL are activated, in order to prevent row hammering. The active cell array 200 may include a plurality of unit cells C coupled to a word line WL. In the active cell array 200, a plurality of unit cells C may be coupled to one word line WL.

In the plurality of unit cells C of the active cell array 200, a row line may be selected by the word line, a column line may be selected by the column enable signal EN, and the active count of the word line WL may be stored in the corresponding unit cell C.

For example, in the active cell array 200, about 10 unit cells may be coupled per word line WL. The number of unit cells C coupled to each word line WL may not be limited thereto, but changed according to a preset active count (count value CNTth to be described below).

Under the supposition that row hammering occurs when the word line WL is activated ten thousands times or more, for example, 14 unit cells C ($2^{14}$=16,364) may be coupled per word line WL. Under the supposition that row hammering occurs when the word line WL is activated hundred thousands times or more, 17 unit cells C ($2^{17}$=131,072) may be coupled per word line WL.

The read control circuit 300 may sense and amplify cell data applied from the active cell array 200 through an input/output line RHIO, and output data DATA to the active control circuit 500. When the column enable signal EN is activated, the read control circuit 300 my read and amplify the active count of the word line, stored in the active cell array 200, and output the amplified count as the data DATA. The read control circuit 300 may perform a read operation in response to a strobe signal SA_STB. The read control circuit 300 can be operated separately from the sense amplifier IOSA which is used during a normal operation.

The write control circuit 400 may drive write data WD applied form the active control circuit 500, and output the driven data to the active cell array 200 through the input/output line RHIO. The write control circuit 400 may perform a write operation in response to a write enable signal WT_EN. The write control circuit 400 can be operated separately from the write driving circuit WTDRV which is used during a normal operation.

The active control circuit 500 may output write data WD, a row hammer flag signal RHF, a strobe signal SA_STB, the write enable signal WT_EN and the column enable signal EN, in response to a row active signal RACT and the data DATA. The row active signal RACT may be used to enable a specific row line (word line WL) of the active cell array 200.

The active control circuit 500 may delay the row active signal RACT and output the strobe signal SA_STB, the write enable signal WT_EN and the column enable signal EN. The active control circuit 500 may count the data DATA and output write data WD to the write control circuit 400. When the data DATA corresponds to a preset count value, the active control circuit 500 may activate the row hammer flag signal RHF for performing a row hammer operation.

Figure 3:
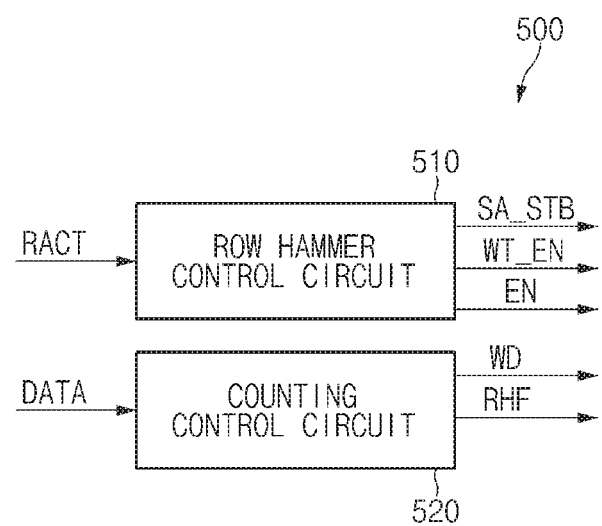
FIG. 3 is a configuration diagram illustrating a representation of an example of an active control circuit of FIG. 2.

FIG. 3 is a configuration diagram illustrating a representation of an example of the active control circuit 500 of FIG. 2.

The active control circuit 500 may include a row hammer control circuit 510 and a counting control circuit 520.

The row hammer control circuit 510 may delay the row active signal RACT, and generate the strobe signal SA_STB for controlling the read control circuit 300 and the write enable signal WT_EN for controlling the write control circuit 400. The row hammer control circuit 510 may delay the row active signal RACT and generate the column enable signal EN for selecting a column line of the active cell array 200.

The counting control circuit 520 may count the data DATA, and output write data WD to the write control circuit 400. The counting control circuit 520 may compare the data DATA to a preset counting value, and activate the row hammer flag signal RHF for performing a row hammer operation, when the counting value of the data DATA corresponds to the preset counting value.

Figure 4:
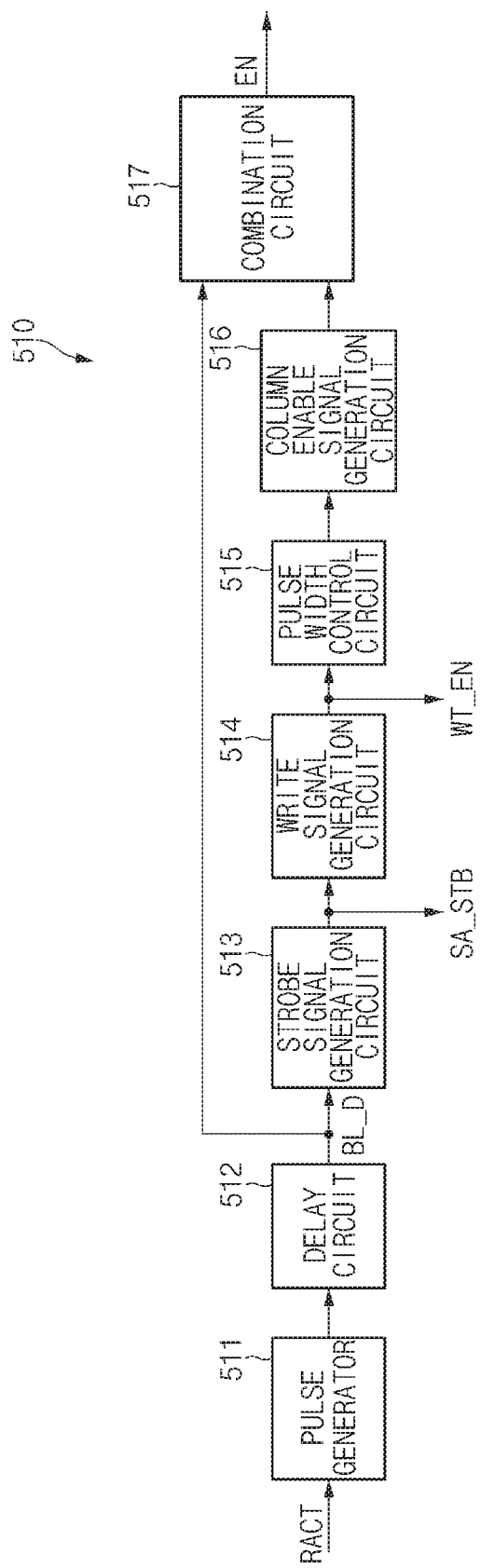
FIG. 4 is a configuration diagram illustrating a representation of an example of a row hammer control circuit of FIG. 3.

FIG. 4 is a configuration diagram illustrating a representation of an example of the row hammer control circuit 510 of FIG. 3.

The row hammer control circuit 510 may include a pulse generator 511, a delay circuit 512, a strobe signal generation circuit 513, a write signal generation circuit 514, a pulse width control circuit 515, a column enable signal generation circuit 516 and a combination circuit 517.

The pulse generator 511 may receive the row active signal RACT and generate a pulse signal. The delay circuit 512 may delay an output of the pulse generator 511 by the time during which charge of a bit line is developed, and output a delayed signal BL_D. The delayed signal BL_D may be used as the column enable signal EN through the combination circuit 517.

The strobe signal generation circuit 513 may delay the delayed signal BL_D, and generate the strobe signal SA_STB for controlling the read control circuit 300. That is, the strobe signal generation circuit 513 may delay the delayed signal BL_D by the time during which cell data of the active cell array 200 are transmitted to the read control circuit 300, and then activate the strobe signal SA_STB.

The write signal generation circuit 514 may delay the strobe signal SA_STB, and generate the write enable signal WT_EN for controlling the write control circuit 400. That is, the write signal generation circuit 514 may receive the strobe signal SA_STB, delay the received signal by the time during which an adder 521 performs an addition operation for read data, and activate the write enable signal WT_EN.

The pulse width control circuit 515 may control the pulse width of the write enable signal WT_EN. The column enable signal generation circuit 516 may generate the column enable signal EN in response to an output signal of the pulse width control circuit 515.

The combination circuit 517 may output the delayed signal BL_D as the column enable signal EN for selecting a column line of the active cell array 200, or output the output of the column enable signal generation circuit 516 as the column enable signal EN. That is, the combination circuit 517 may select the output of the delay circuit 512 and output the selected signal as the column enable signal EN during a read operation, or select the output of the column enable signal generation circuit 516 and output the selected signal as the column enable signal EN during a write operation.

The combination circuit 517 may include a logic gate, for example, an OR gate which enables the column enable signal EN when one or more of the delayed signal BL_D and the output signal of the column enable signal generation circuit 516 are activated.

Figure 5:
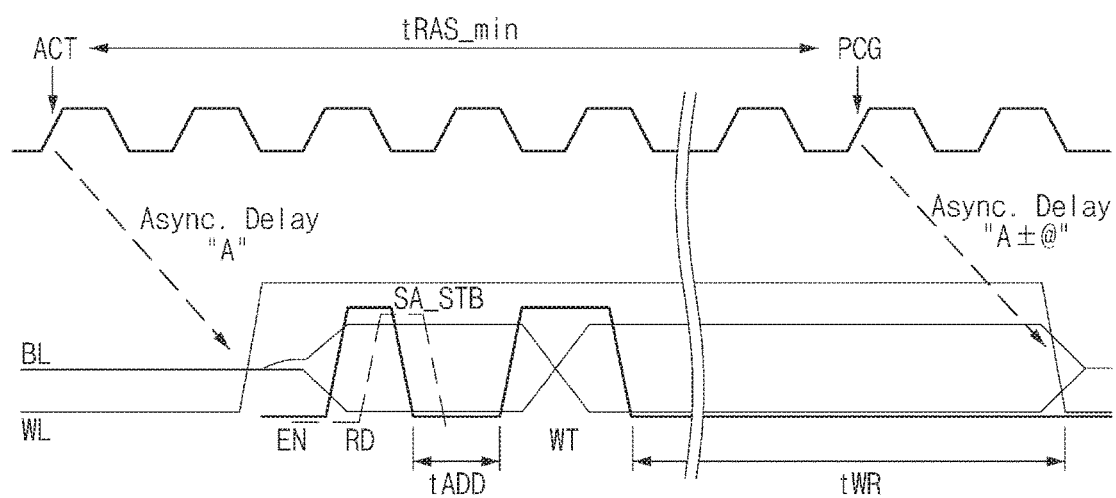
FIG. 5 is a waveform diagram for describing an example of the operation of a row hammer control circuit of FIG. 4.

FIG. 5 is a waveform diagram for describing an example of the operation of the row hammer control circuit 510 of FIG. 4.

When a minimum row active signal TRAS_min elapses after an active command ACT is applied, a precharge command PCG may be applied.

The minimum row active time TRAS_min may indicate a time required for determining a delay time for a refresh start signal. According to the specification defining the minimum row active time tRAS_min, the minimum row active time tRAS_min may indicate a minimum time which needs to be guaranteed before the precharge command PCG is applied after the active command ACT is applied.

For example, when the active command ACT is applied, a corresponding memory cell may be activated, and the bit line sense amplifier may sense and amplify cell data of the memory cell. Only when the precharge command PCG is applied after the sensing and amplifying operation of the sense amplifier is completed, a loss of the cell data may not occur.

That is, the minimum row active time tRAS_min may indicate a minimum delay time which is required for guaranteeing an active period of a semiconductor memory element, such that cell data are not lost. For reference, a RAS access time tRAS may indicate a time which needs to be secured in order to complete a read or write operation.

When a delay time A elapses after the active command ACT is applied, the word line WL may be activated to a high level. Then, the charge of the bit line BL may start to be developed while charge distribution is performed in the bit line BL. Then, the memory cells of the cell array CA and the unit cells of the active cell array 200 may be activated.

Then, the pulse generator 511 may generate a pulse of the column enable signal EN in response to the row active signal RACT. At this time, the column enable signal EN may be activated after being delayed by the delay time of the delay circuit 512, during a read operation RD.

Then, after the column enable signal EN is activated, the column enable signal EN may be delayed by the delay time of the strobe signal generation circuit 513, and the strobe signal SA_STB may be activated to operate the read control circuit 300. That is, since the read control circuit 300 is operated after being delayed by the delay time of the strobe signal generation circuit 513, the read control circuit 300 may be stably operated after the charge of the bit line BL is sufficiently amplified.

Then, when the delay time of the write signal generation circuit 514 elapses after the column enable signal EN is deactivated, the write enable signal WT_EN may be activated. At this time, the delay time of the write signal generation circuit 514 may correspond to an addition time tADD during which the adder 521 performs an addition operation.

After the addition time tADD elapses, the column enable signal EN may be reactivated during a write operation WT. The pulse width at which the column enable signal EN is enabled may be determined by the delay time of the pulse width control circuit 515. At this time, the pulse width control circuit 515 may have an option of increasing or decreasing the pulse width.

Then, when the column enable signal EN is disabled, a precharge operation may be performed after a write recovery time tWR. The write recovery time tWR may indicate a time during which a precharge command can be applied after the point of time that a data write command is applied. That is, when a delay time (A±@) elapses after the precharge command PCG is applied, the word line may be disabled, and the precharge operation may be performed.

The active cell array 200 may be operated in order of active operation, read operation, write operation and precharge operation. Thus, when the pulse width of the column enable signal EN is increased by the pulse width control circuit 515, the write recovery time tWR can be improved.

Figure 6:
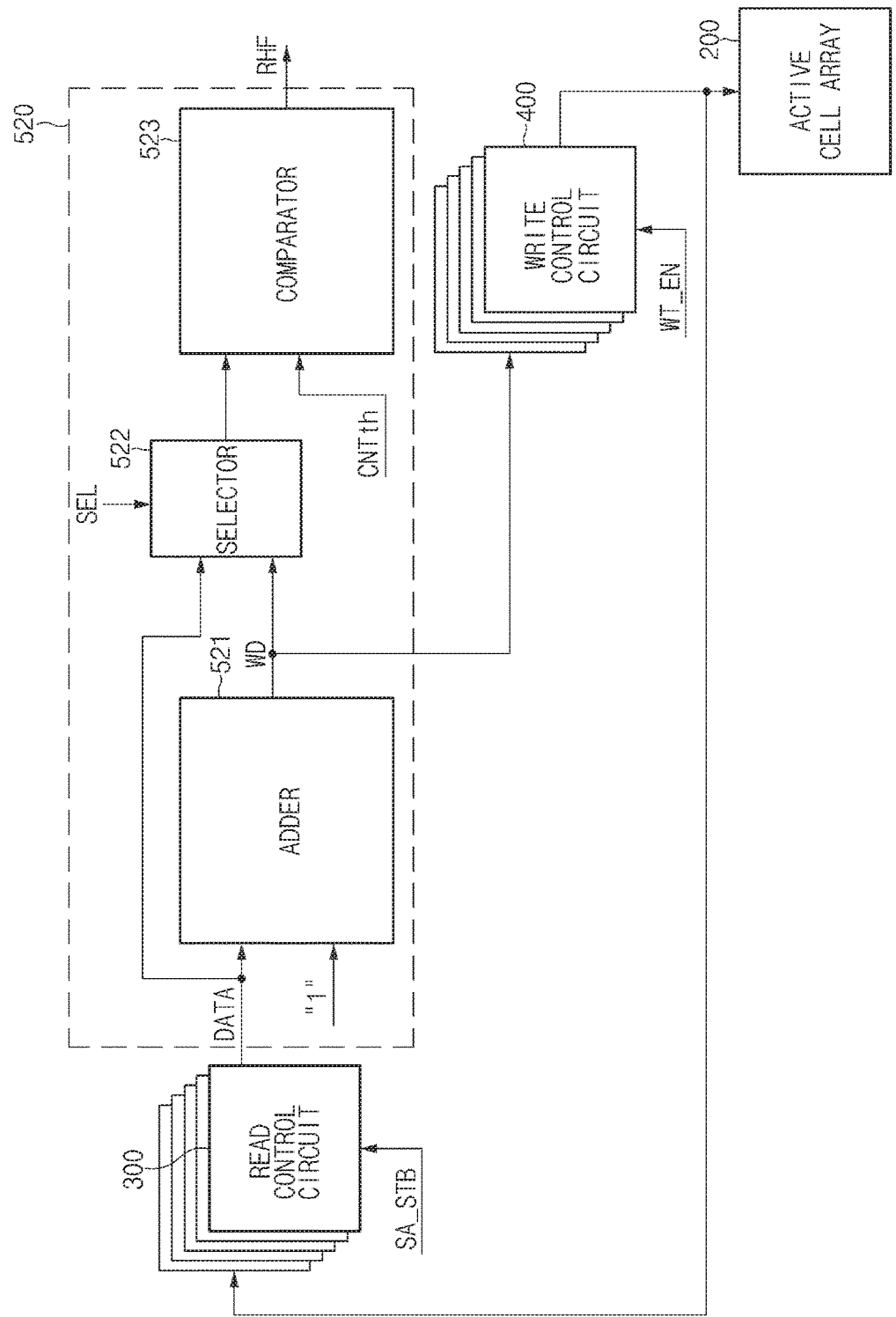
FIG. 6 is a detailed configuration diagram illustrating a representation of an example of a counting control circuit of FIG. 3.

FIG. 6 is a detailed configuration diagram illustrating a representation of an example of the counting control circuit 520 of FIG. 3.

The counting control circuit 520 may include an adder 521, a selector 522 and a comparator 523.

When a specific word line WL is activated, the adder 521 may count how many times the corresponding word line WL was activated. That is, the adder 521 may count data DATA applied from the read control circuit 300, add "1" to the data, and output write data WD.

When the write enable signal WT_EN is activated, the write control circuit 400 may drive the write data WD, to which "1" was added by the adder 521, and rewrite the driven data to the active cell array 200.

The selector 522 may select the data DATA applied from the read control circuit 300 or the write data WD applied from the adder 521, in response to a select signal SEL. For example, the selector 522 may select a count value of 999 or a count value of 1,000 to which "1" was added by the adder 521, as the value of the data DATA.

The comparator 523 may compare the preset count value CNTth to the output of the selector 522, and output the row hammer flag signal RHF. For example, when the count value CNTth is preset to 1,000, the comparator 523 may determine whether the value outputted from the selector 522 corresponds to 1,000.

When the preset count value CNTth is equal to or larger than the output value of the selector 522, the comparator 523 may activate the row hammer flag signal RHF to a high level. When the row hammer flag signal RHF is activated, an additional refresh operation may be performed on an adjacent word line of which the address is larger or smaller by one than the corresponding word line address, in response to the next refresh command.

Figure 7:
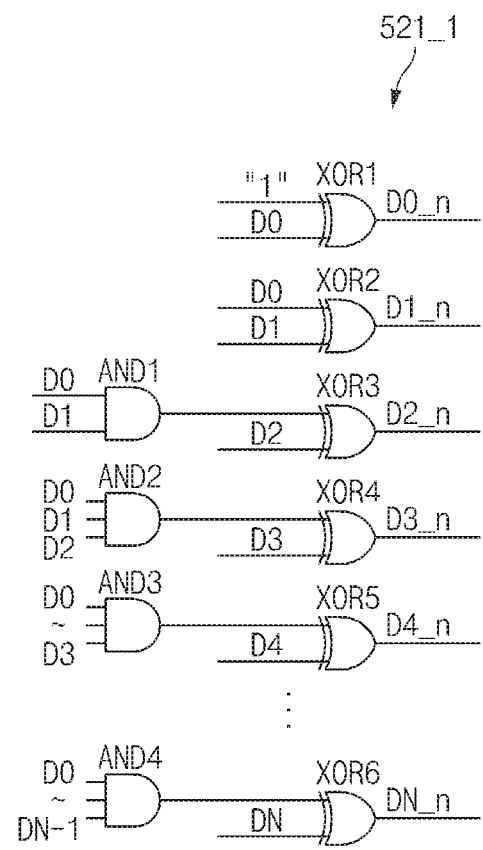
FIGS. 7 and 8 are circuit diagrams illustrating representations of examples of an adder of FIG. 6.
Figure 8:
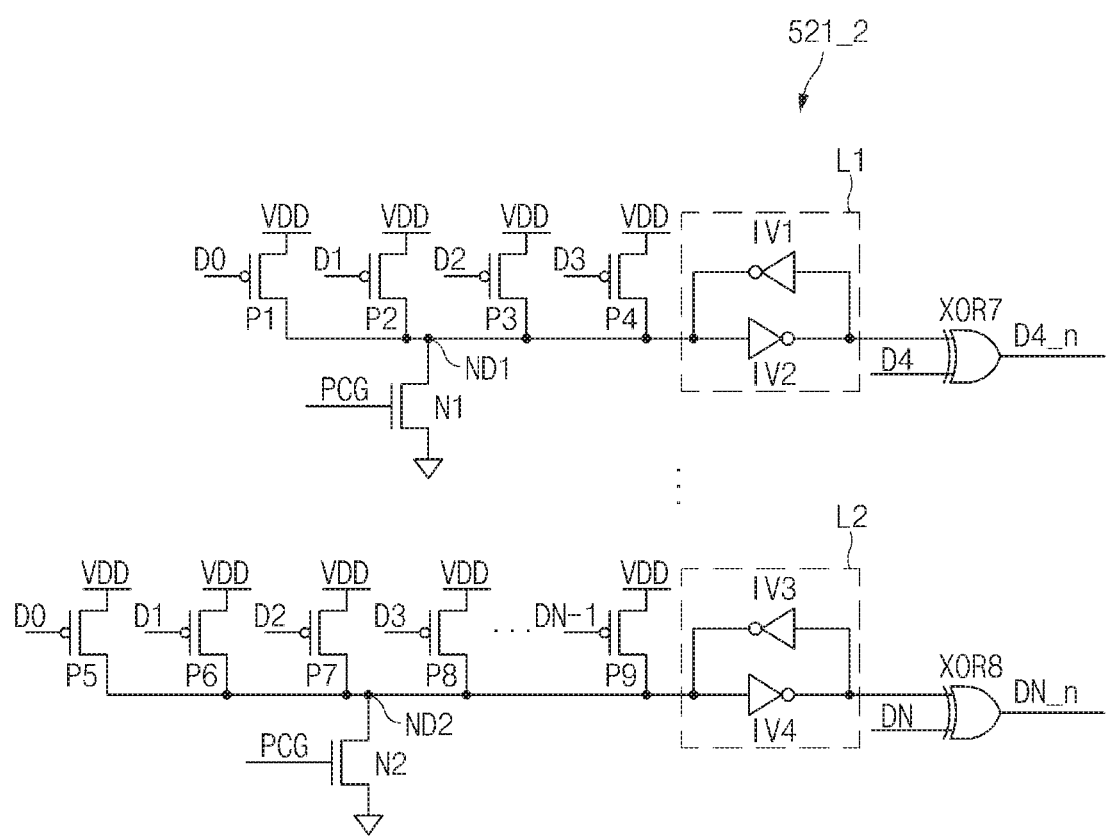

FIGS. 7 and 8 are circuit diagrams illustrating representations of examples of the adder 521 of FIG. 6.

The adder of FIG. 7 will be represented by reference numeral 521_1, and the adder of FIG. 8 will be represented by reference numeral 521_2.

The adder 521_1 illustrated in FIG. 7 may include a plurality of logic gates, for example, AND gates AND1 to AND4 and a plurality of logic gates, for example, XOR gates XOR1 to XOR6.

The AND gate AND1 may perform an AND operation on data D0 and D1. The AND gate AND2 may perform an AND operation on data D0 to D2. The AND gate AND3 may perform an AND operation on data D0 to D3. The AND gate AND4 may perform an AND operation on data D0 to DN−1.

The XOR gate XOR1 may perform an XOR operation data "1" and the data D0, and output data D0_n. The XOR gate XOR2 may perform an XOR operation on the data D0 and the data D1, and output data D1_n. The XOR gate XOR3 may perform an XOR operation on an output of the AND gate AND1 and the data D2, and output data D2_n.

The XOR gate XOR4 may perform an XOR operation on an output of the AND gate AND2 and the data D3, and output data D3_n. The XOR gate XOR5 may perform an XOR operation on an output of the AND gate AND3 and the data D4, and output data D4_n. The XOR gate XOR6 may perform an XOR operation on an output of the AND gate AND4 and the data DN, and output data DN_n.

The plurality of data D0 to DN illustrated in FIG. 7 may serve as input data of the adder 521 illustrated in FIG. 6, and correspond to the data DATA. The plurality of data D0_n to DN_n may serve as output data of the adder 521, and correspond to the write data WD.

Since the adder 521_1 always adds "1" to input data, the adder 521_1 may add "1" to the Nth data DN only when all of the data D0 to DN−1 are at a high level. Thus, when all of the data D0 to DN−1 are outputted at a high level through the plurality of AND gates AND1 to AND4, the data DN_n may be outputted at a high level.

For example, when the data D0 to DN−1 are all at a high level and the data DN is at a high level, the data DN_n may be outputted at a low level. When the data D0 to DN−1 are all at a high level and the data DN is at a low level, the data DN_n may be outputted at a high level. That is, when all of the data D0 to DN−1 are at a high level, a value obtained by inverting the data Dn may be outputted as the data DN_n.

When the data D0 to DN−1 are all at a low level and the data DN is at a low level, the data DN_n may be outputted at a low level. When the data D0 to DN−1 are all at a low level and the data DN is at a high level, the data DN_n may be outputted at a high level. That is, when all of the data D0 to DN−1 are at a low level, the value of the data Dn may be outputted as the data DN_n.

The adder 521_2 illustrated in FIG. 8 may include a plurality of PMOS transistors P1 to P9 (switching element), NMOS transistors N1 and N2 (enable circuit), latches L1 and L2 (latch circuit) and logic gates, for example, XOR gates XOR7 and XOR8 (logic operation circuit).

The plurality of PMOS transistors P1 to P4 may be coupled in parallel between a supply voltage terminal VDD and a node ND1, and receive data D0 to D3 through the gate terminals thereof. The NMOS transistor N1 may be coupled between the node ND1 and a ground voltage terminal, and receive a precharge signal based on a precharge command PCG through the gate terminal thereof.

The latch L1 may include inverters IV1 and IV2 of which input/output terminals are coupled to each other, and latch an output of the node ND1. The XOR gate XOR7 may perform an XOR operation on an output of the latch L1 and data D4, and output data D4_n.

The plurality of PMOS transistors P5 to P9 may be coupled in parallel between the supply voltage terminal VDD and a node ND2, and receive data D0 to DN−1 through the gate terminals thereof. The NMOS transistor N2 may be coupled between the node ND2 and the ground voltage terminal, and receive a precharge signal based on the precharge command PCG through the gate terminal thereof.

The latch L2 may include inverters IV3 and IV4 of which input/output terminals are coupled to each other, and latch an output of the node ND2. The XOR gate XOR8 may perform an XOR operation on an output of the latch L2 and data DN, and output data DN_n.

The adder 521_2 may precharge the nodes ND1 and ND2 to a low level when the precharge command PCG is activated. Then, when one or more of the data D0 to DN−1 are applied at a low level, the corresponding PMOS transistors may be turned on to output the data D4_n and DN_n at a low level.

Figure 9:
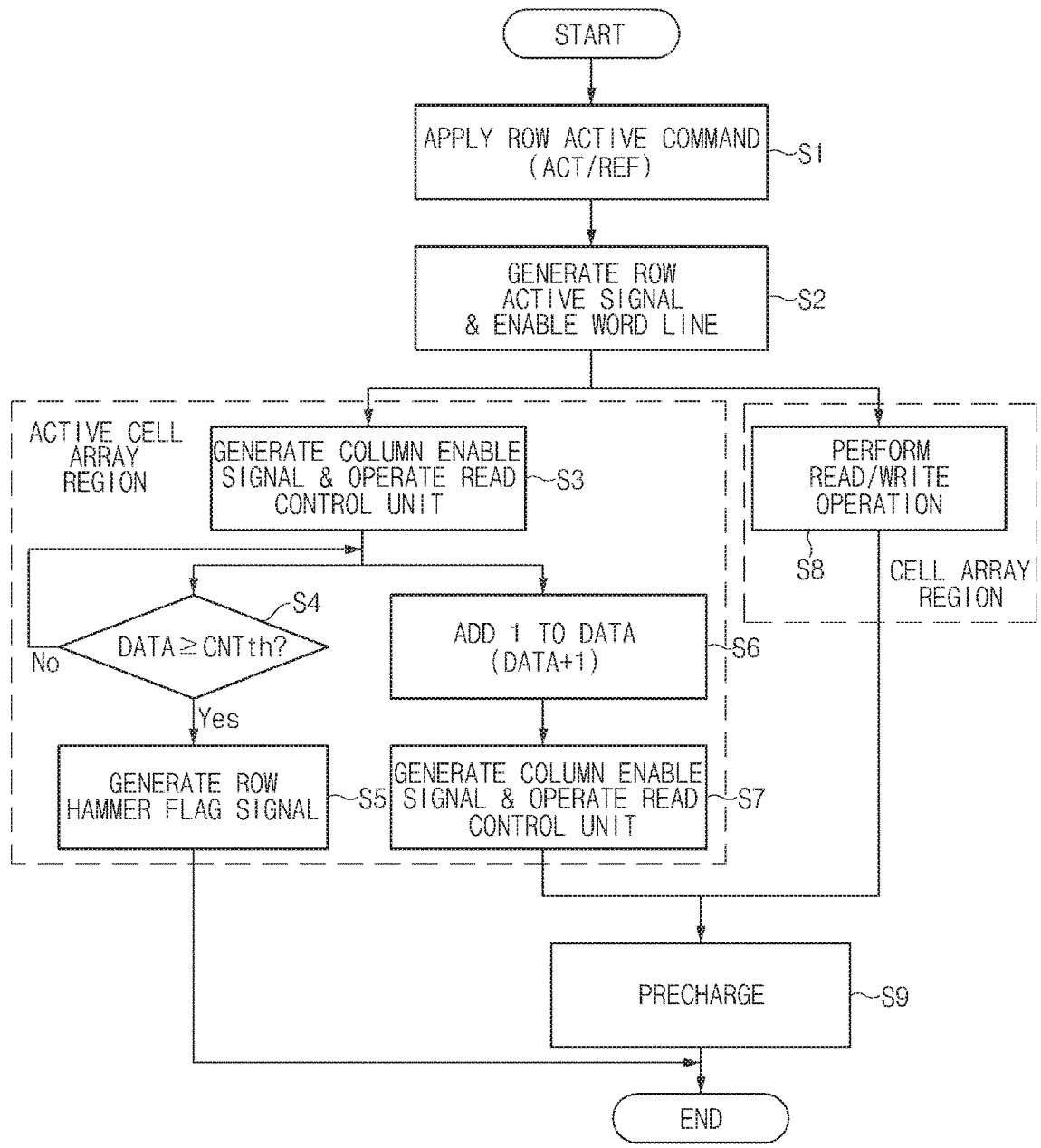
FIG. 9 is an operation flowchart example of the memory according to an embodiment.

FIG. 9 is an operation flowchart example of the memory according to an embodiment.

First, a row active command for accessing a row line may be applied to the memory at step S1. The row active command may include any one of an active command ACT and a refresh command REF.

Then, a row active signal RACT may be activated in response to the row active command, and a specific word line WL may be enabled to activate the corresponding cell of the cell array CA and the corresponding unit cell of the active cell array 200, at step S2.

The active cell array 200 may enable a column line in response to activation of the column enable signal EN. Then, during a read operation RD, the strobe signal SA_STB may be activated to operate the read control circuit 300 at step S3.

Then, the comparator 523 may compare data DATA sensed from the read control circuit 300 to a preset count value CNTth at step S4. When the data DATA is equal to or greater than the preset count value CNTth, the comparator 523 may activate the row hammer flag signal RHF to perform a row hammering operation on the corresponding word line WL, at step S5.

When the row hammer flag signal RHF is activated, a refresh operation may be performed on an adjacent word line of which the address is larger or smaller by one than the corresponding word line address, in response to the next refresh command.

The adder 521 may add "1" to the data DATA sensed from the read control circuit 300, and output write data WD at step S6. Then, the write control circuit 400 may be operated in response to the column enable signal EN, and drive the write data WD to the read control circuit 300, at step S7.

The write data WD to which "1" is added by the adder 521 may be driven by the write control circuit 400 and rewritten to the active cell array 200.

At this time, when an active operation is performed once, a precharge command may be applied after the minimum row active time TRAS_min. Thus, the operation of reading the active count of the word line, adding "1" to the active count, and writing back the addition result to the active cell array 200 needs to be performed within the minimum row active time TRAS_min.

When the row active signal RACT and the word line WL are activated, a normal read or write operation for the cell array CA may be performed at step S8. Then, when the precharge command PCG is activated, the precharge operation may be performed at step S9.

The steps S3 to S7 may indicate the operation performed in the active cell array 200, and the step S9 may indicate the operation performed in the normal cell array CA.

Figure 10:
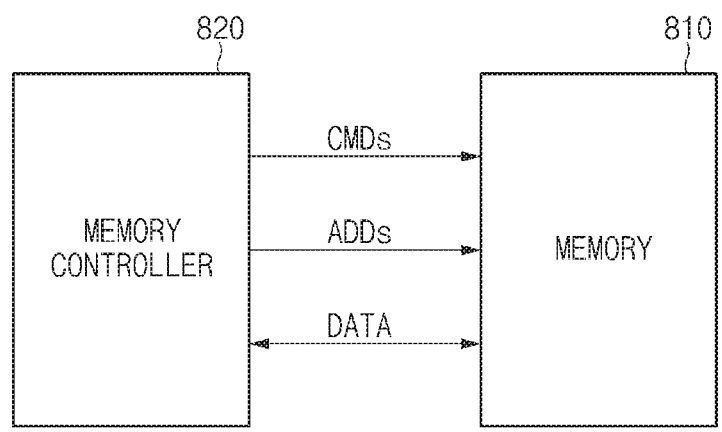
FIG. 10 is a configuration diagram illustrating a representation of an example of a memory system according to an embodiment.

FIG. 10 is a configuration diagram illustrating a representation of an example of a memory system according to an embodiment.

Referring to FIG. 10, the memory system may include a memory 810 and a memory controller 820. The memory controller 820 may apply commands CMDs and addresses ADDs to the memory 810, and control the operation of the memory 810. The memory controller 820 may exchange data DATA with the memory 810 during a read or write operation.

The memory controller 820 may transmit command signals CMDs to input an active command ACT, a precharge command PCG, a refresh command REF, a self refresh entry command and a self refresh exit command to the memory 810.

The memory controller 820 may transmit addresses ADDs for selecting a cell block and a word line to be activated in the memory 810 which transmits the active command ACT. The memory controller 820 may periodically transmit the refresh command REF to the memory 810, and transmit the self refresh entry command and the self refresh exit command in order to control the self refresh mode of the memory 810.

The memory 810 may include the memory described with reference to FIGS. 2 to 9. The memory 810 may detect the address of a high active word line. The memory 810 may store the address of the high active word line, and generate a target address. The memory 810 may perform a target refresh operation using the target address whenever a refresh operation is performed a predetermined number of times, during a normal refresh operation.

When entering the self refresh mode, the memory 810 may periodically perform a refresh operation even though the refresh command REF is not received from the memory controller 820.

For reference, the components of the memory 810 to perform refresh operations may be configured and operated in the same manner as described with reference to FIGS. 2 to 9. The memory system may determine whether an active count corresponds to a preset number of times or more during an active command, and perform a target refresh operation on a word line adjacent to a high active word line, thereby reducing an error caused by word line disturbance.

According to the embodiments, the memory may determine whether a specific word line was activated a preset number of times, and refresh an adjacent word line of the corresponding address.

While certain embodiments have been described above, it will be understood to those skilled in the art that the embodiments described are by way of example only. Accordingly, the memory described herein should not be limited based on the described embodiments. Rather, the memory described herein should only be limited in light of the claims that follow when taken in conjunction with the above description and accompanying drawings.

What is claimed is:

1. A memory comprising:
    an active cell array comprising a plurality of unit cells coupled to a word line and configured to store an active count of the word line;
    a read control circuit configured to read data stored in the active cell array based on a strobe signal;
    a write control circuit configured to store write data in the active cell array based on a write enable signal; and
    an active control circuit configured to generate the strobe signal and the write enable signal, and activate a row hammer flag signal for refreshing an adjacent word line of the corresponding word line based on output data of the read control circuit,
    wherein the active control circuit controls the strobe signal and the write enable signal based on a row active signal.

2. The memory according to claim 1, wherein the active control circuit comprises:
    a row hammer control circuit configured to delay a row active signal, and generate the strobe signal, the write enable signal and a column enable signal; and
    a counting control circuit configured to count the data applied from the read control circuit and output the write data and the row hammer flag signal.

3. The memory according to claim 2, wherein the row hammer control circuit comprises:
    a pulse generator configured to generate a pulse signal based on the row active signal; and
    a delay circuit configured to generate the column active signal by delaying an output of the pulse generator.

4. The memory according to claim 3, wherein the delay circuit has a delay time corresponding to a time during which a bit line is developed while charge distribution of the bit line is performed.

5. The memory according to claim 3, wherein the row hammer control circuit further comprises a strobe signal generation circuit configured to generate the strobe signal by delaying an output of the delay circuit.

6. The memory according to claim 5, wherein the strobe signal generation circuit has a delay time corresponding to a time during which sensing data of the active cell array are transmitted to the read control circuit.

7. The memory according to claim 2, wherein the row hammer control circuit further comprises a write signal generation circuit configured to generate the write enable signal by delaying the strobe signal.

8. The memory according to claim 7, wherein the write signal generation circuit has a delay time corresponding to a time during which an addition operation is performed on the active count of the word line.

9. The memory according to claim 2, wherein the row hammer control circuit further comprises a pulse width control circuit configured to control the pulse width of the write enable signal.

10. The memory according to claim 9, wherein the row hammer control circuit further comprises a column enable signal generation circuit configured to generate a column enable signal based on an output of the pulse width control circuit.

11. The memory according to claim 10, wherein the row hammer control circuit further comprises a combination circuit configured to select a delayed signal obtained by delaying the row active signal during a read operation or select an output of the column enable signal generation circuit during a write operation, and output the selected signal as the column enable signal.

12. The memory according to claim 2, wherein the counting control circuit comprises:
    an adder configured to add a one to data applied from the read control circuit and output the write data;
    a selector configured to select any one of the output of the adder and the data; and
    a comparator configured to compare an output of the selector to a preset count value, and output the row hammer flag signal.

13. The memory according to claim 12, wherein the write data outputted from the adder is driven through the write control circuit and written to the active cell array.

14. The memory according to claim 12, wherein the adder comprises:
    at least one AND gate configured to perform an AND operation on N data; and
    at least one XOR gate configured to perform an XOR operation on outputs of the at least one AND gate, the one of data and the N data, and output the N data plus the one of data.

15. The memory according to claim 12, wherein the adder comprises:
    a plurality of switching elements coupled in parallel between a supply voltage terminal and a first node, and configured to receive N data through gate terminals thereof;
    an enable circuit coupled between the first node and a ground voltage terminal, and controlled by a precharge signal;
    a latch circuit configured to latch an output of the first node; and
    a logic operation circuit configured to perform an operation on an output of the latch circuit and the data.

16. A memory system comprising:
    a cell array configured to perform any one of read, write and refresh operations for data, when a word line is enabled;
    an active cell array comprising a plurality of unit cells coupled to the word line and configured to store an active count of the word line; and
    a refresh control circuit configured to control the read or write operation of the active cell array, and activate a row hammer flag signal for refreshing an adjacent word line of the corresponding word line based on the active count of the word line,
    wherein the refresh control circuit comprises:
    a read control circuit configured to read data stored in the active cell array based on a strobe signal;
    a write control circuit configured to store write data in the active cell array based on a write enable signal; and an active control circuit configured to generate the strobe signal and the write enable signal, and activate the row hammer flag signal based on output data of the read control circuit, wherein the active control circuit controls the strobe signal and the write enable signal based on a row active signal.

17. The memory according to claim 16, wherein the active control circuit comprises:

a row hammer control circuit configured to delay a row active signal and generate the strobe signal, the write enable signal and a column enable signal; and a counting control circuit configured to count data applied from the read control circuit, and output the write data and the row hammer flag signal.

18. The memory according to claim 16, further comprising a memory controller configured to transmit a row active command, an address and data to the cell array and the refresh control circuit.

* * * * *

UNITED STATES PATENT AND TRADEMARK OFFICE
CERTIFICATE OF CORRECTION

PATENT NO. : 9,685,240 B1  
APPLICATION NO. : 15/204010  
DATED : June 20, 2017  
INVENTOR(S) : Min Su Park Page 1 of 1

It is certified that error appears in the above-identified patent and that said Letters Patent is hereby corrected as shown below:

In the Claims

Column 11, Claim 3, Line 42, should read as follows:
3. The memory according to claim 2, wherein the row hammer control circuit comprises:
a pulse generator configured to generate a pulse signal based on the row active signal; and
a delay circuit configured to generate the column enable signal by delaying an output of the pulse generator.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*